United States Patent [19]

Scheller

[11] Patent Number: 4,806,870

[45] Date of Patent: Feb. 21, 1989

[54] PHASE COMPARATOR AND DATA SEPARATOR

[75] Inventor: P. Karl Scheller, Rochester, N.H.

[73] Assignee: Data General Corporation, Westboro, Mass.

[21] Appl. No.: 142,042

[22] Filed: Jan. 11, 1988

[51] Int. Cl.$^4$ .......................... H03K 3/02; H03K 9/06
[52] U.S. Cl. .................................. 328/109; 307/518;
    307/479; 307/265; 328/110; 328/134; 328/55
[58] Field of Search ............... 307/269, 265, 266, 267,
    307/510, 479, 511, 514, 440, 518; 328/133, 134,
    55, 155, 63, 62, 110, 134, 109; 331/1 A, 25;
    375/119–120

[56] References Cited

U.S. PATENT DOCUMENTS

| | | | |
|---|---|---|---|
| 4,568,881 | 2/1986 | Kostrov | 328/109 |
| 4,636,748 | 1/1987 | Latham, II | 331/17 |
| 4,754,225 | 6/1988 | Minuhin | 328/133 |
| 4,764,737 | 8/1988 | Kaatz | 328/133 |

*Primary Examiner*—Stanley D. Miller
*Assistant Examiner*—Richard Roseen

[57] ABSTRACT

A phase comparator for use in a phase-locked loop, responsive to CLOCK and DATA signals, for producing UP and DOWN commands exhibiting a difference in duration proportional to the phase difference between the CLOCK and DATA signals, for controlling the charge pump of the loop, can be used with half-clock times as fast as one gate delay and one flip-flop delay, rendering it useful for high-speed operation.

4 Claims, 2 Drawing Sheets

PHASE COMPARATOR AND DATA SEPARATOR

BACKGROUND OF THE INVENTION

1. Field of the Invention

This invention relates to phase comparators and data separators for use in conjunction with phase-locked loops, and particularly to phase comparators useful at high data rates.

1. Description of the Prior Art

References:

U.S. Pat. No. 4,636,748, Jan. 13, 1987, Paul W. Latham, II, Charge Pump For Use in a Phase-Locked Loop (hereinafter "Latham", incorporated herein by reference).

U.S. Pat. No. 4,568,881, Feb. 4, 1986, Anna Kostrov, Phase Comparator and Data Separator (hereinafter "Kostrov", incorporated herein by reference).

Type II phase-locked loops are commonly used for synchronizing a clock signal with a data signal. See Latham, particularly at column 1, lines 26–54, and column 2, line 55 through column 3, line 21.

An element of the phase-locked loop is the phase comparator, which generates "UP" and "DOWN" commands to the charge pump of the loop, with the UP and DOWN commands exhibiting a difference in duration proportional to the phase difference between the clock and data signals. Work has been done to speed up the operation of phase comparators rendering them suitable for use at high data rates, on the order of 100 MHz. (See Kostrov, particularly at column 1, lines 7 through 31, and column 2, line 19 through column 6, line 13.)

The fastest known prior-art phase comparator, that depicted in Kostrov's FIG. 2, requires two gate delays and one flip-flop setup time to occur within half a clock period for proper operation. For example, the DATA signal going high on lead 10 must propagate through OR-gate 32 to clock flip-flop Q1; after Q1's setup time, its Q output must propagate through OR-gate 40 to effect the UP command. Similarly, the output of OR-gate 32 primes flip-flop Q2 which triggers on the next rising edge of CLK-NOT; after Q2's setup time, its Q output must propagate through OR-gate 42 to effect the DOWN and SEPARATED DATA signals.

Kostrov states, at column 6, lines 9–13:

"Consequently, the sum of the propagation delays through flip-flop Q2, OR gate 34 and flip-flop Q1 should be no greater than about one-half of duration of the bit cell (no greater than 5 nanoseconds for a clock frequency of 100 MHz)."

To achieve this timing constraint requires a very fast state-of-the-art integrated circuit (IC) process. The present invention provides a phase comparator in which only two comparable delays are encountered, enabling it to be constructed with more common, less expensive IC process or discrete devices (or alternatively, allowing operation well in excess of 100 MHz if constructed of very fast IC process).

It is thus a general object of the present invention to provide a phase comparator useful at high speeds.

It is a particular object of the present invention to provide a phase comparator allowing half-clock periods as short as one gate delay plus one flip-flop delay time.

Other advantages of the present invention will become apparent to one skilled in the art after reviewing the following description of the preferred embodiment and the appended drawings, wherein:

DETAILED DESCRIPTION

Figure 1:
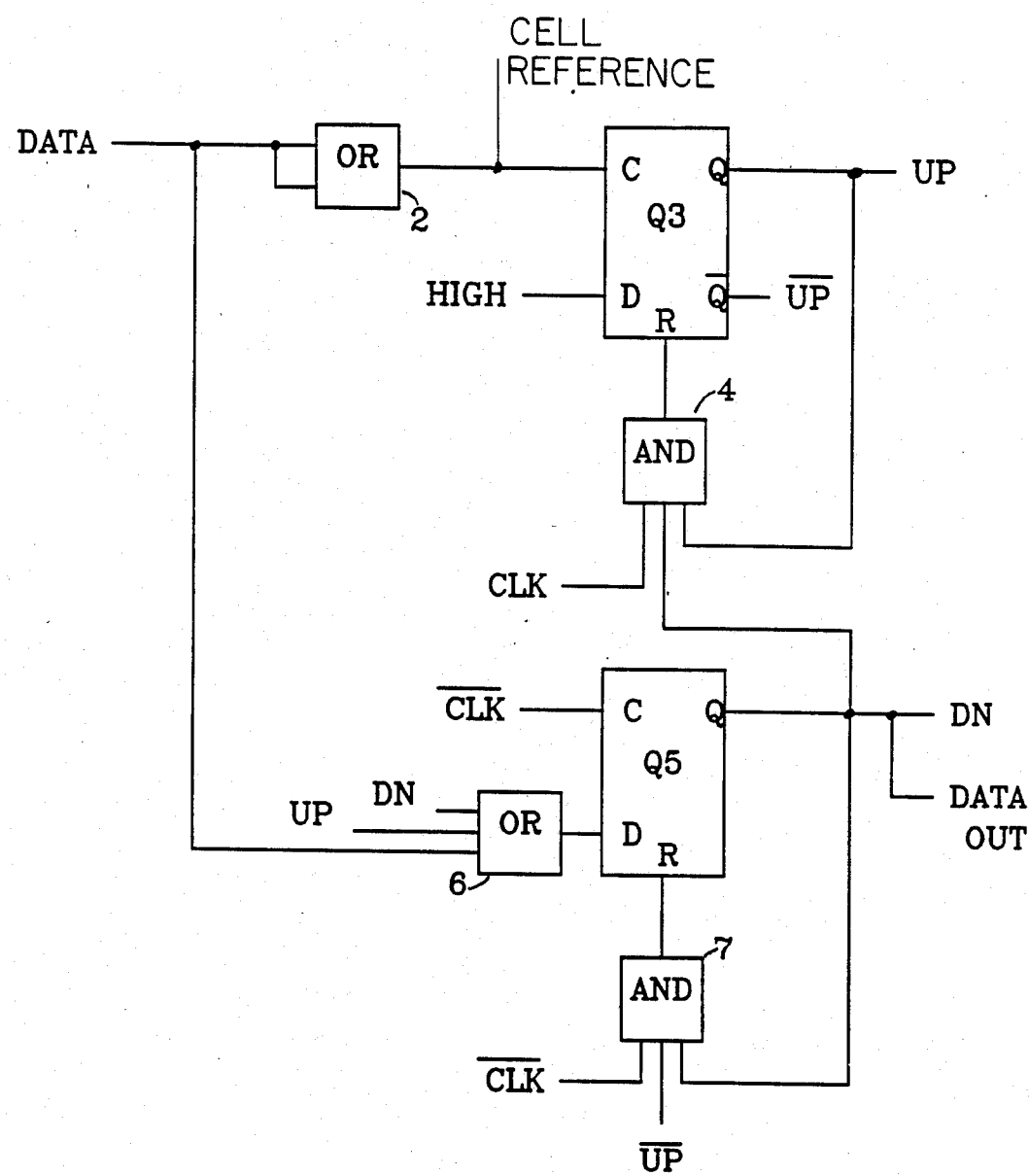
FIG. 1 is a logic diagram of the phase comparator of the present invention.

FIG. 1 is a logic diagram of the phase comparator of the present invention. It comprises D flip-flops Q3 and Q5, OR gates 2 and 6, and AND gates 4 and 7.

The incoming DATA signal is applied to OR gates 2 and 6; the CLK signal (and its inverse, CLK-NOT) are seen to be applied to several of the network elements.

The appearance of DATA, through OR gate 2, clocks Q3 on (the D input being permanently wired to a HIGH), producing the UP command. DATA or UP, through OR gate 6, enable the D input of Q5 so that the next rise of CLK-NOT will clock Q5 on, producing the DN signal. UP and DN prime AND gate 4, enabling the next rise of CLK to get through and reset Q3, producing UP-not. DN and UP-not prime AND gate 7, enabling the next rise of CLK-NOT to get through and reset Q5, thus returning the network to the state it had prior to the occurrence of the DATA signal. It will be appreciated that each of these actions requires at most one gate delay and one flip-flop delay from a transition of DATA or CLK to the occurrence of UP or DN respectively.

Figure 2:
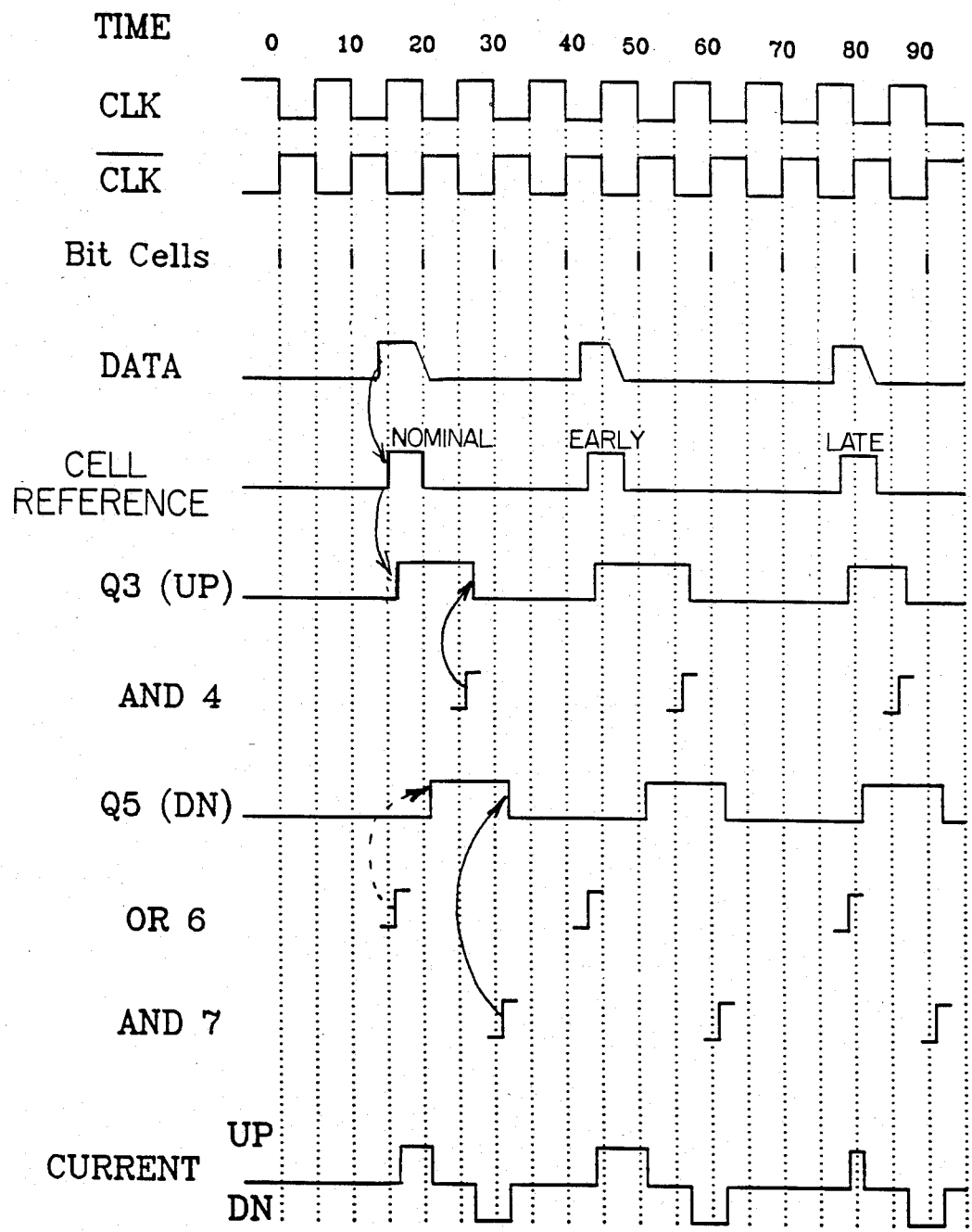
FIG. 2 is a timing chart for the phase comparator of the present invention.

FIG. 2 is a timing chart for the logic network of Figure 1. CLK and CLK-NOT are depicted at the top, followed by a depiction of successive bit cells, each bit cell (period when a DATA signal might occur) being from a fall of CLK to the next fall of CLK. Timing numbers are given at the very top; these numbers may be taken as nanoseconds for 100 MHz operation, or may be taken as relative numbers for some other rate. Three assumed DATA signals are then depicted: the first is assumed to be nominally centered in the bit cell (i.e., with its rising edge coinciding with a rise of CLK); the second is assumed to occur early; the third is assumed to occur late.

Taking first the nominal DATA signal, it is seen that the output of OR gate 2 goes true as a direct result of the DATA signal but after the gate delay time; this transition to the true state clocks flip-flop Q3 to the one state after the flip-flop delay. The DATA signal likewise causes a true output from OR gate 6, which the UP signal subsequently sustains; this true output is present at the D input of flip-flop Q5 at the next transition to high of CLK-NOT which, after the flip-flop delay time, results in asserting the DN signal (and also the SYNCHRONIZED DATA OUT signal).

UP and DN prime AND gate 4, which becomes fully enabled upon the next high-transition of CLK; its output goes true one gate delay thereafter, resetting Q3; the UP signal is deasserted and UP-not is asserted one flip-flop time after that.

DN and UP-not prime AND gate 7, which is fully enabled by the next rise of CLK-NOT; the output of AND gate 7 resets Q5 after the gate delay of AND gate 7, and the DN signal is deasserted one flip-flop time later. The network is thus returned to the state it had prior to the occurrence of the DATA signal.

UP and DOWN currents are depicted in the bottom line of FIG. 2. As a function of the charge pump disclosed in Latham, neither UP nor DOWN current flows when the UP and DN commands are simultaneously true or simultaneously false; thus, UP current flows when the UP signal is asserted and the DN signal is not, and DOWN current flows when the DN signal is present and the UP signal is not.

Analyses of the state changes invoked by the early and late occurrences of the DATA signal are analogous to the analysis of the nominal occurrence given hereinabove. The resetting of Q3 and the setting and resetting of Q5 are effected by CLK or CLK-NOT signals, while the setting of Q3 is effected by the DATA signal. Thus, the time of occurrence of the DATA signal relative to CLK signals controls the relative durations of UP and DOWN currents in such a manner as to adjust the phase-locked loop's control voltage so as to adjust the frequency and phase of CLK to track with the frequency and phase of DATA. Occurrences of DATA that are early or late by more than half a bit cell will be decoded as a late member of the previous bit cell or an early bit in the following cell.

The invention may be embodied in yet other specific forms without departing from the spirit or essential characteristics thereof. Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A phase comparator responsive to an input pulse stream and a cyclic clock signal for producing, after each input pulse occurrence, a first and a second command having a difference in duration proportional to a phase difference between the input pulse occurrence and the clock signal, the phase comparator comprising:
   a first bistable device, the true state of whose output is the first command;
   a second bistable device, the true state of whose output is the second command;
   first setting means for setting the first bistable device in response to a high-transition of the input pulse;
   second setting means for setting the second bistable device in response to the next low-transition of the clock signal;
   first resetting means for resetting the first bistable device in response to the next high-transition of the clock signal; and
   second resetting means for resetting the second bistable device in response to the next low-transition of the clock signal.

2. The phase comparator recited in claim 1, wherein the first and second bistable devices are flip-flop circuits.

3. The phase comparator recited in claim 1 wherein:
   the first setting means comprises an OR gate responsive to the input pulse stream;
   the first resetting means comprises an AND gate responsive to the clock signal, the true state of the first bistable device, and the true state of the second bistable device; and
   the second resetting means comprises an AND gate responsive to the false state of the clock signal, the false state of the first bistable device, and the true state of the second bistable device.

4. The phase comparator recited in claim 2, wherein:
   the first setting means comprises an OR gate responsive to the input pulse stream;
   the first resetting means comprises an AND gate responsive to the clock signal, the true state of the first bistable device, and the true state of the second bistable device; and
   the second resetting means comprises an AND gate responsive to the false state of the clock signal, the false state of the first bistable device, and the true state of the second bistable device.

* * * * *